US009837592B2

(12) United States Patent
Ho et al.

(10) Patent No.: US 9,837,592 B2
(45) Date of Patent: Dec. 5, 2017

(54) CERAMIC SUBSTRATE AND SEMICONDUCTOR PACKAGE HAVING THE SAME

(71) Applicant: Viking Tech Corporation, Hsinchu County (TW)

(72) Inventors: Chien-Hung Ho, Hsinchu County (TW); Chiu-Min Lee, Hsinchu County (TW); Chen-Shen Kuo, Hsinchu County (TW)

(73) Assignee: Vikiing Tech Corporation, Hukou Township (TW)

( * ) Notice: Subject to any disclaimer, the term of this patent is extended or adjusted under 35 U.S.C. 154(b) by 181 days.

(21) Appl. No.: 14/517,781

(22) Filed: Oct. 17, 2014

(65) Prior Publication Data

US 2015/0303362 A1 Oct. 22, 2015

(30) Foreign Application Priority Data

Apr. 16, 2014 (TW) .............................. 103113820 A

(51) Int. Cl.
*H05K 1/02* (2006.01)
*H05K 1/11* (2006.01)
(Continued)

(52) U.S. Cl.
CPC ............ *H01L 33/642* (2013.01); *H01L 24/73* (2013.01); *H01L 33/641* (2013.01);
(Continued)

(58) Field of Classification Search
CPC .. H05K 1/0203; H05K 1/0204; H05K 1/0206;
H05K 1/0212; H05K 1/306; H05K 1/113;
H05K 2201/10106; H01L 33/642; H01L 33/641; H01L 24/73; H01L 2224/73265;
H01L 33/647; H01L 2224/48237; H01L 2224/16225;
(Continued)

(56) References Cited

U.S. PATENT DOCUMENTS 5,285,352 A * 2/1994 Pastore ................... H01L 23/36
165/185
6,611,055 B1 * 8/2003 Hashemi ............. H01L 23/3677
257/706

(Continued)

*Primary Examiner* — Hoa C Nguyen
(74) *Attorney, Agent, or Firm* — Davis & Bujold PLLC;
Michael J. Bujold

(57) ABSTRACT

A ceramic substrate is provided, including: a board having a first surface and a second surface opposing the first surface; first electrical contact pads disposed on the first surface; second electrical contact pads disposed on the second surface; conductive pillars disposed in the board and connecting the first surface and the second surface to electrically connect the electrical contact pad and the second electrical contact pad; a first heat conductive pad disposed on the first surface; a second heat conductive pad disposed on the second surface; and a heat conductive pillar disposed in the board and connecting the first surface and the second surface to contact and be coupled with the first heat conductive pad and the second heat conductive pad, wherein the heat conductive pillar has a width greater than or equal to widths of the conductive pillars and greater than or equal to 300 micrometers.

8 Claims, 4 Drawing Sheets

(51) Int. Cl.
*H01L 33/64* (2010.01)
*H01L 23/00* (2006.01)
*H05K 1/03* (2006.01)

(52) U.S. Cl.
CPC .......... *H05K 1/0206* (2013.01); *H01L 33/647* (2013.01); *H01L 2224/16225* (2013.01); *H01L 2224/48091* (2013.01); *H01L 2224/48237* (2013.01); *H01L 2224/73257* (2013.01); *H01L 2224/73265* (2013.01); *H05K 1/0306* (2013.01); *H05K 1/113* (2013.01); *H05K 2201/10106* (2013.01)

(58) Field of Classification Search
CPC . H01L 2224/48091; H01L 2224/73257; H01L 2924/00014
See application file for complete search history.

(56) References Cited

U.S. PATENT DOCUMENTS

| | | | |
|---|---|---|---|
| 6,960,824 B1* | 11/2005 | Hashemi | H01L 23/3677 257/698 |
| 7,894,199 B1* | 2/2011 | Chang | H01L 23/49822 174/262 |
| 2002/0149102 A1* | 10/2002 | Hashemi | H01L 23/3677 257/706 |
| 2002/0172025 A1* | 11/2002 | Megahed | H01L 23/3677 361/767 |
| 2008/0179737 A1* | 7/2008 | Haga | H01L 23/3677 257/717 |
| 2012/0105096 A1* | 5/2012 | Kuah | G01R 31/2812 324/763.01 |
| 2014/0126156 A1* | 5/2014 | Naganuma | H05K 1/0206 361/719 |

* cited by examiner

CERAMIC SUBSTRATE AND SEMICONDUCTOR PACKAGE HAVING THE SAME

BACKGROUND OF THE INVENTION

Field of the Invention

The present invention relates to ceramic substrates, and, more particularly, to a ceramic substrate having a heat dissipating function.

Description of Related Art

With rapid growth in the electronic industry, electronic products are moving towards miniaturization, high functionality, and high operational speed. In order to extend the lifetime of electronic device, the industry focuses on the heat dissipation function. A light-emitting diode (LED) has several advantages, such as strong durability, small size, high vibration resistance, and high power efficiency, and is therefore widely used in the illuminating electronic devices.

In a conventional LED package, an LED chip is disposed on a ceramic substrate followed by the packaging process. As shown in FIG. 1A, a ceramic substrate 1 comprises: a board 10 having a first surface 10a and a second surface 10b, a plurality of electrical contact pads 11 disposed on the first surface 10a, a plurality of conductive pillars 13 disposed in the board 10 and connecting the first surface 10a and the second surface 10b to electrically connect with a first electrical contact pad 11 and a second electrical contact pad 12, and a metal heat sink 14 disposed on the second surface 10b. The heat generated by the LED chip during operation can be conducted from the board 10 to the second surface 10b and the heat sink 14.

However, in the conventional ceramic substrate 1 the coefficient of heat conductivity of the ceramic material of the board 10 is between 17-170 w/mk, which is far below that of the metal heat sink 14. Therefore, it takes much time for the heat generated by the LED chip to be conducted from the first surface 10a of the board 10 to the second surface 10b. Therefore, the LED package has poor heat dissipating efficiency, and the LED chip is easily failed.

A solution is proposed to extend the disposing area of some first electrical contact pads 11 of the ceramic substrate 1, so as to increase the metal conductivity pathways. As shown in FIG. 1B, a ceramic substrate 1' has first electrical contact pads 11'. However, the via is small for the conductive pillar 13, with a radius of 100-200 μm, which is used for electrically connecting with the first electrical contact pads 11, 11' and the second electrical contact pads 12. As a result, the heat conductivity function is not so obvious by using the conductive pillar, and the majority of heat generated by the LED chip must be conducted through the board 10. This leads to poor heat dissipation.

A different design of electrode according to the surface mounted device (SMD) is developed, by coupling part of the second electrical contact pads 12 with the metal heat sink 14 to form a ceramic substrate 1 with a large heat sink 14', as shown in FIG. 1C. However, due to the small via size of the conductive pillars 13, 13', the majority of heat still needs to be dissipated from the board 10, thereby failing to make efficient heat dissipation.

Accordingly, there is an urgent need to solve the foregoing problem of poor heat dissipation.

SUMMARY OF THE INVENTION

In view of the foregoing problems, the present invention provides a ceramic substrate, comprising: a board having a first surface and a second surface opposing the first surface; a plurality of first electrical contact pads disposed on the first surface; a plurality of second electrical contact pads disposed on the second surface; a plurality of conductive pillars disposed in the board and connecting the first surface and the second surface to electrically connect the first electrical contact pads and the second electrical contact pads; a first heat conductive pad disposed on the first surface; a second heat conductive pad disposed on the second surface; and a heat conductive pillar disposed in the board and connecting the first and second surface to contact and be coupled the first heat conductive pad and the second heat conductive pad, wherein the width of the heat conductive pillar is greater than or equal to 300 micrometers, and is greater than or equal to widths of the conductive pillars.

The present invention further provides an electronic package structure, comprising: a board having a first surface and a second surface opposing the first surface; a plurality of first electrical contact pads disposed on the first surface; a plurality of second electrical contact pads disposed on the second surface; a plurality of conductive pillars disposed in the board and connecting the first surface and the second surface to electrically connect the first electrical contact pads and the second electrical contact pads; at least a first heat conductive pad disposed on the first surface; at least a second heat conductive pad disposed on the second surface; at least a heat conductive pillar disposed in the board and connecting the first surface and the second surface to contact and be coupled with the first heat conductive pad and the second heat conductive pad, wherein the width of the heat conductive pillar is greater than or equal to 300 micrometers and greater than or equal to the widths of the conductive pillars; and at least an electronic element disposed on the first surface of the board, each being corresponding in position and coupled to the first heat conductive pad, and the electronic element has a first side having a plurality of first electrodes electrically connected with the first electrical contact pads.

In an embodiment, the first side of the electronic element is coupled with the first heat conductive pad; or the second side of the electronic element is coupled with the first heat conductive pad.

In an embodiment, a second electrode is disposed on the second side of the electronic element and electrically connected with the first electrical contact pad.

In an embodiment, the ceramic substrate has a plurality of heat conductive pathways and a plurality of electronic elements mounted thereon.

In an embodiment, the ceramic substrate has only one heat conductive pathway consisting of the first heat conductive pad, the heat conductive pillar and the second heat conductive pad, and the heat conductive pathway does not function as an electrical connection means.

In an embodiment, a heat conductive and electrical connection pathway consists of the first heat conductive pad, the heat conductive column and the second heat conductive pad. For instance, the first electrode of the electronic elements is further electrically connected with the first heat conductive pad.

In an embodiment, the board is made of a ceramic material.

In an embodiment, the first heat conductive pad, the second heat conductive pad or the heat conductive pillar is made of copper or aluminum.

In an embodiment, the coefficient of heat conductivity of the first heat conductive pad, the second heat conductive pad or the heat conductive pillar is greater than that of the board.

In an embodiment, the heat conductive pillar has a terminal surface occupying more than 1.6% of the first surface or the second surface of the board.

In an embodiment, the width of the heat conductive pillar is greater than or equal to 300 micrometers, and is greater or equal to the widths of the conductive pillars. Therefore, the majority of heat can be rapidly transferred from the first surface to the second surface (only very small part of the heat can be transferred through the board), and the heat dissipating efficiency is thus improved. In comparison with prior art, the electronic elements will not be damaged due to excessive heat.

BRIEF DESCRIPTION OF DRAWINGS

The present invention can be more fully understood by reading the following detailed description of the preferred embodiments, with reference made to the accompanying drawings, wherein.

DETAILED DESCRIPTION OF PREFERRED EMBODIMENTS

The present invention is described in the following with specific embodiments, so that one skilled in the pertinent art can easily understand other advantages and effects of the present invention from the disclosure of the present invention.

It is to be understood that the scope of the present invention is not limited to the disclosed embodiments. On the contrary, it is intended to cover various modifications and similar arrangements. The scope of the claims, therefore, should be accorded the broadest interpretation so as to encompass all such modifications and similar arrangements. In addition, words such as "on", "first", "second" and "one" are used to explain the preferred embodiment of the present invention only and should not limit the scope of the present invention.

Figure 1A:
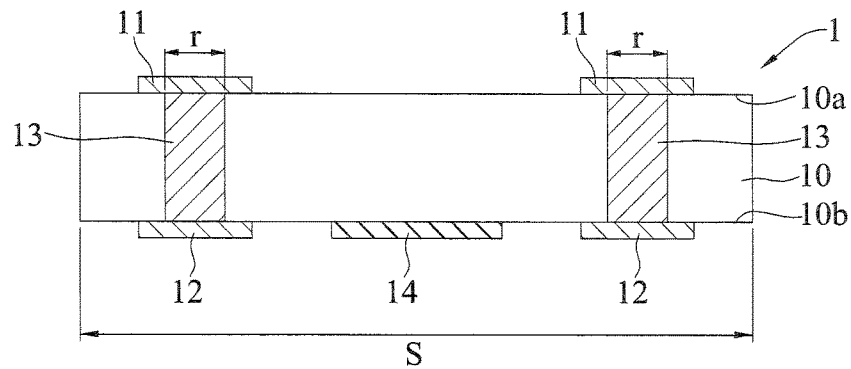
FIGS. 1A-1C are cross-sectional views of a conventional electronic package of different models.
Figure 1B:
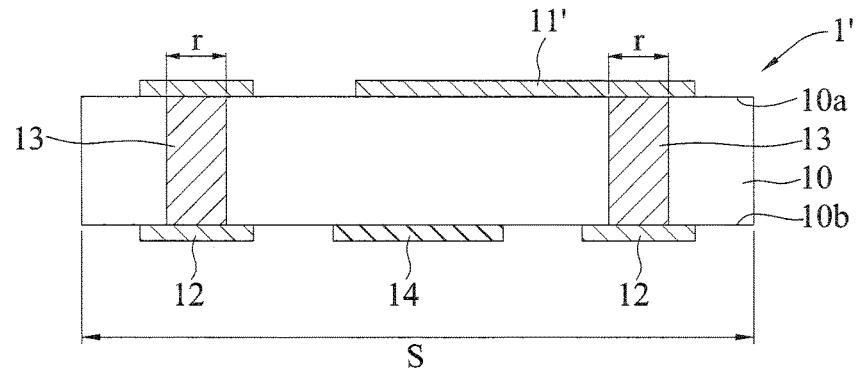
Figure 1C:
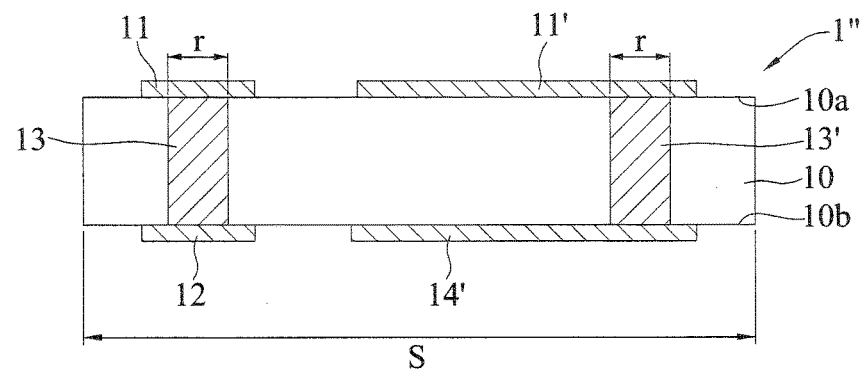
Figure 2A:
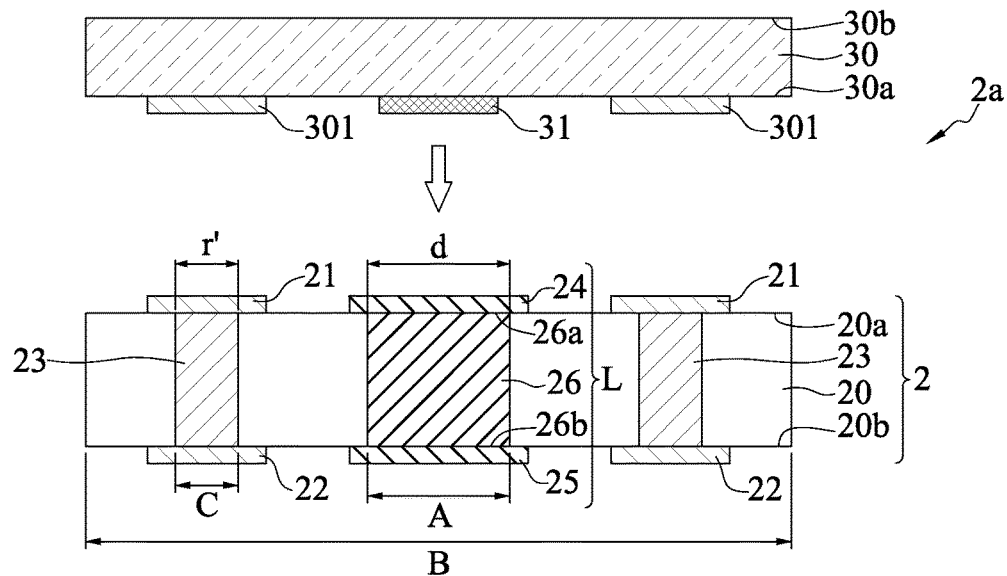
FIGS. 2A-2B are schematic views showing an electronic package in accordance with a first embodiment of the present invention.
Figure 2B:
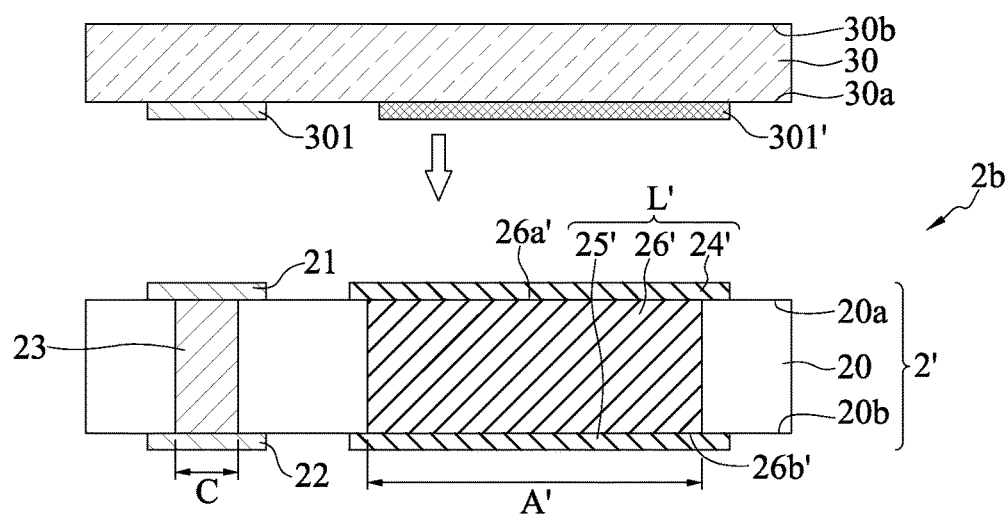

FIGS. 2A-2B are schematic views showing an electronic package 2a, 2b and an ceramic substrate 2, 2' in accordance with a first embodiment of the present invention;

As shown in FIG. 2A, the electronic package 2a comprises a ceramic substrate 2 and an electronic element 30.

The ceramic substrate 2 comprises: a board 20, a plurality of first electrical contact pads 21, a plurality of second electrical contact pads 22, a plurality of conductive pillars 23, a first heat conductive pad 24, a second heat conductive pad 25, and a heat conductive pillar 26.

The board 20 has a first surface 20a and a second surface 20b opposing the first surface 20a. The board 20 is made of aluminum nitride (AlN) or aluminum oxide ($Al_2O_3$), wherein the heat conductivity of aluminum oxide is 17 w/mk and heat conductivity of aluminum nitride is 170 w/mk.

The first electrical contact pad 21 is disposed on the first surface 20a of the board 20.

The second electrical contact pad 22 is disposed on the second surface 20b of the board 20.

The conductive pillars 23 are disposed in the board 20 and connecting with the first and second surface 20a, 20b, for electrically connecting with the first and second electrical contact pads 21, 22.

The first heat conductive pad 24 is disposed on the first surface 20a of the board 20, and the coefficient of heat conductivity of the heat conductive pad 24 is greater than the coefficient of heat conductivity of the board 20. In an embodiment, the first heat conductive pad 24 is made of copper or aluminum. The coefficient of heat conductivity of copper is 400 w/mk, and the coefficient of heat conductivity of aluminum is 250 w/mk.

The second heat conductive pad 25 is disposed on the second surface 20b of the board 20, and the coefficient of heat conductivity of the second heat conductive pad 25 is greater than that of the board, and the second heat conductive pad 25 is made of copper or aluminum.

The heat conductive pillar 26 is disposed in the board and connecting the first and second surface 20a, 20b for connecting the first and second heat conductive pads 24, 25. The width (d) of the heat conductive pillar 26 (area A of the first terminal surface 26a and area A of the second terminal surface 26b) is greater than or equal to the width r' of the conductive pillar 23 (or the terminal area C). The width d of the heat conductive pillar 26 and the width r' of the conductive pillar 23 are both greater than or equal to 300 μm.

In an embodiment, the surface A of the first terminal surface 26a of a heat conductive pillar 26 is 1.6% or more of the area B of the first surface 20a of the board 20. The second terminal surface 26b of the heat conductive pillar 26 is 1.6% or more of the area B of the second surface 20b of the board 20.

In an embodiment, the area B of the first surface 20a of the board is 3.5 mm×3.5 mm, and the heat conductive pillar 26 is a cylinder with 0.5 mm (500 μm) in diameter (i.e., the width d). The area A of the first terminal surface 26a of a single heat conductive pillar 26 is 1.60% of the area B of the first surface 20a of the board 20. In another embodiment, the area B of the first surface 20a of the board 20 is 1.6 mm×1.6 mm, and the single heat conductive pillar 26 with the diameter of 0.5 mm is 7.67% of the area B of the first surface 20a of the board 20.

In an embodiment, the ceramic substrate 2 has only one heat conductive pathway L consisting of the heat conductive pad 24, the heat conductive pillar 26 and the second heat conductive pad 25, and the heat conductive pathway L does not function as an electrical conduction means.

The electronic element 30 is disposed on the first surface 20a of the board 20 and is coupled to the first heat conductive pad 24. The electronic element 30 has a first surface 30a, a second surface 30b opposing the first surface 30a, and a plurality of first electrodes 301 disposed on the first side 30a and electrically connected with the first electrical contact pad 21.

In an embodiment, the electronic element 30 is a highly power efficient element, such as a semiconductor element or an illuminative element such as an LED chip. Note that the electronic element 30 is not limited to the foregoing examples.

The electronic element 30 is electrically connected with the ceramic substrate 2 using a flip-chip method, such that the first electrode 301 is coupled to the corresponding first electrical contact pad 21.

In an embodiment, a heat dissipating pad 31 is disposed on a first side 30a of the electronic element 30, corresponding to the first heat conductive pad 24, and coupled to the corresponding first heat conductive pad 24.

In the ceramic substrate 2' shown in FIG. 2B, a single first electrical contact pad 21 is disposed on the first surface 20a of the board 20, an electrical thermal conductive path L' consists of the first heat conductive pad 24', the heat conductive pillar 25' and the second heat conductive pad 26'. The width of the heat conductive pillar 25' (i.e. the area A' of the first terminal surface 26a' or second terminal surface 26b') is greater than or equal to the width of the conductive pillar 23 (area C of terminal surface). Therefore, a part of the first electrode 301' of the electronic element 30 can be used as a heat dissipating pad so as to be coupled to the corresponding first heat conductive pad 24', so as to transfer heat and electricity using the thermal conductive path L'.

In the ceramic substrate 2' according to the present invention, since the width of the heat conductive pillar 25' is greater than or equal to the width of the conductive pillar 23, as compared to the conventional technology, the heat conductive pillar 25' can act as a thermal conductive path L' which can rapidly dissipate heat as well as to prevent loss of electrical conductivity.

In other embodiments, if the ceramic substrate 2 has a plurality of heat conductive paths or thermal conductive paths, a plurality of electronic elements are disposed on the ceramic substrate, such that a single electronic element is coupled to the corresponding conductive path or single thermal conductive path.

Figure 3:
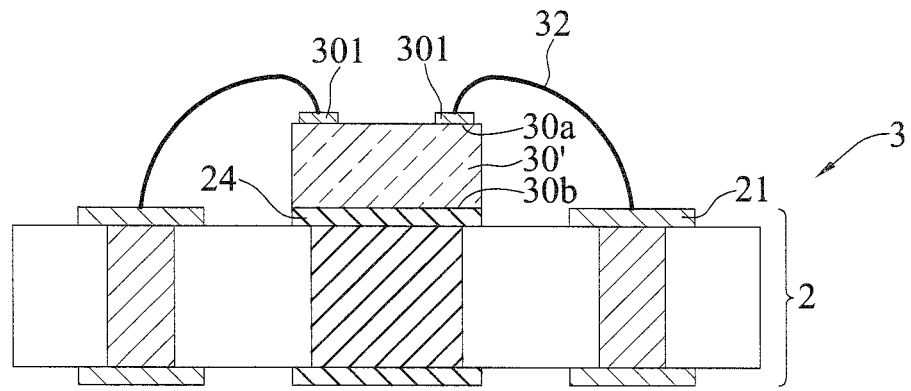
FIGS. 3 and 3' are schematic cross-sectional views showing an electronic package in accordance with a second embodiment of the present invention.
Figure 3:
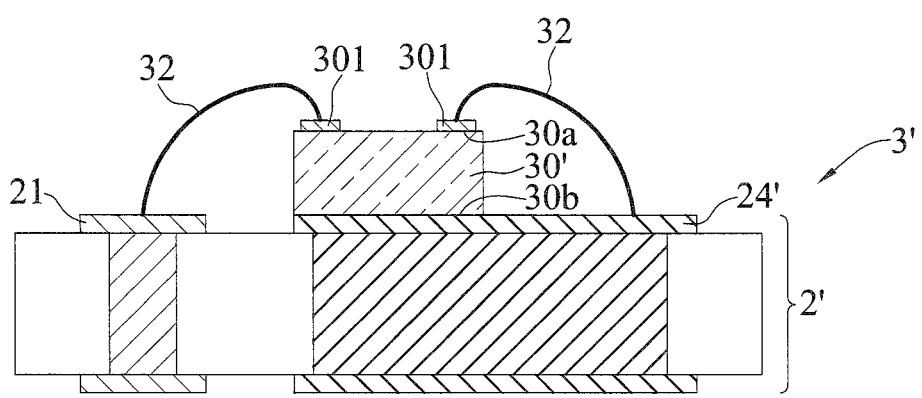

FIGS. 3 and 3' are schematic cross-sectional views showing an electronic package in accordance with a second embodiment of the present invention. The second embodiment differs from the first embodiment in the design of electronic element 30'.

As shown in FIG. 3, the electronic element 30' is electrically connected to the ceramic substrate 2 via a wire bonding method, i.e., through electrically connecting the plurality of bonding wires 32 with the first electrodes 301 and the first electrical contact pads 21, and the second side 30b of the electronic element 30' are coupled to the first heat conductive pads 24.

Alternatively, as shown in FIG. 3', the second side 30b of the electronic element 30' is coupled to the first heat conductive pad 24' of the ceramic substrate 2', and parts of the bonding wires are electrically connected with the first electrode 301 and first heat conductive pad 24'.

Figure 4:
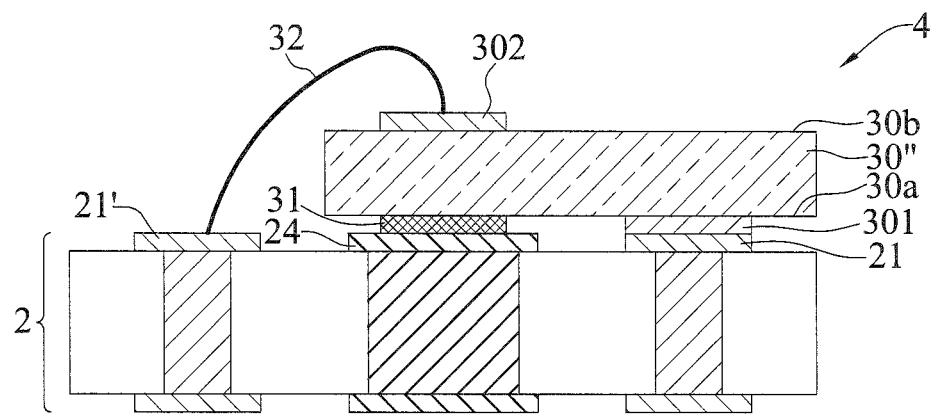
FIGS. 4 and 4' are schematic cross-sectional views showing an electronic package in accordance with a third embodiment of the present invention.
Figure 4:
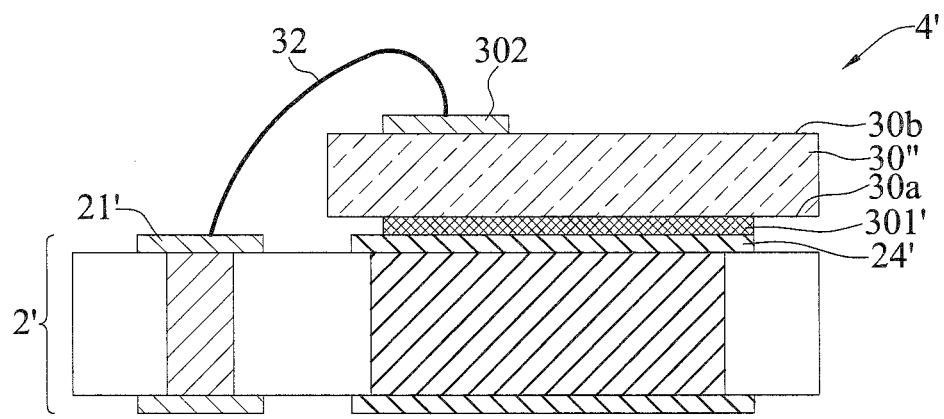

FIGS. 4 and 4' are schematic cross-sectional views showing an electronic package in accordance with a third embodiment of the present invention. The third embodiment differs from the first and second embodiments in the design of electronic element 30''.

As shown in FIG. 4, the electronic element 30'' is electrically connected with the ceramic substrate 2 using a flip chip or wire bonding method.

In an embodiment, a plurality of first electrodes 301 are disposed on the first side 30a of the electronic element 30'' and electrically connected with the first electrical contact pad 21. A plurality of second electrodes 302 are disposed on the second side 30b of the electronic element 30'' and electrically connected with the second electrical contact pad 21'.

The first side 30a of the electronic element 30'' is coupled to the first heat conductive pad 24 via a heat dissipating pad 31 of the electronic element 30''.

Alternatively, as shown in FIG. 4', a part of the first electrode 301' of the electronic element 30'' is coupled and electrically connected with the first heat conductive pad 24' of the ceramic substrate 2'.

In summary, the ceramic substrate and the electronic package having the ceramic substrate proposed by the present invention involve making the width of the conductive pillar to be greater than or equal to 300 μm, such that the majority of heat can be rapidly transferred from the first surface to the second surface (only very small part of the heat can be transferred through the board), so as to increase the heat dissipating efficiency and eliminate any damages of the electronic element due to excessive heat.

The present invention has been described using exemplary preferred embodiments. However, it is to be understood that the scope of the present invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An electronic package, comprising:
    a ceramic substrate, comprising:
        a board having a first surface and a second surface opposing the first surface;
        a plurality of first electrical contact pads disposed on the first surface;
        a plurality of second electrical contact pads disposed on the second surface;
        a plurality of conductive pillars disposed in the board and connecting the first surface and the second surface, so as for the conductive pillars to electrically connect the first electrical contact pads and the second electrical contact pads;
        at least one first heat conductive pad disposed on the first surface;
        at least one second heat conductive pad disposed on the second surface;
        at least one heat conductive pillar disposed in the board and connecting the first surface and the second surface, so as for the at least one heat conductive pillar to contact and be coupled with the first heat conductive pad and the second heat conductive pad, wherein the ceramic substrate has only one heat conductive path consisted of the first heat conductive pad, the heat conductive pillar and the second heat conductive pad, and the heat conductive path does not function as an electrical conductive path, and wherein the heat conductive pillar has a width greater than or equal to widths of the conductive pillars and greater than or equal to 300 micrometers; and
    at least one electronic element mounted on the first surface of the board and coupled to the corresponding first heat conductive pad, wherein the electronic element has a first side, a second side opposing the first side, a single heat dissipating pad disposed on the first side and coupled to the corresponding first heat conductive pad, and a plurality of first electrodes disposed on the first side and electrically connected with the first electrical contact pads, and wherein the single heat dissipating pad only corresponds to the corresponding heat conductive pillar, and the single heat dissipating pad is in contact with the corresponding first heat conductive pad.

2. The electronic package of claim 1, wherein the first electrodes of the electronic element are electrically connected with the first heat conductive pad.

3. The electronic package of claim 1, wherein the heat conductive pillar is made of copper or aluminum.

4. The electronic package of claim 1, wherein the heat conductive pillar has a terminal surface occupying more than 1.6% of the first surface of the board.

5. The electronic package of claim 1, wherein the heat conductive pillar has a terminal surface occupying more than 1.6% of the second surface of the board.

6. The electronic package of claim 1, wherein the first electrodes are coupled to the first heat conductive pad.

7. The electronic package of claim 1, wherein the electronic element further comprises a second electrode disposed on the second side and electrically connected with the first electrical contact pad.

8. The electronic package of claim 1, wherein the ceramic substrate has a plurality of heat conductive paths, and a plurality of the electronic elements are mounted on the ceramic substrate.

* * * * *